(12) United States Patent
Ma et al.

(10) Patent No.: US 8,570,180 B2
(45) Date of Patent: Oct. 29, 2013

(54) RACK SERVER SYSTEM

(75) Inventors: Zhen-Xing Ma, Shenzhen (CN);
Zheng-Heng Sun, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 160 days.

(21) Appl. No.: 13/207,465

(22) Filed: Aug. 11, 2011

(65) Prior Publication Data

US 2012/0306654 A1 Dec. 6, 2012

(30) Foreign Application Priority Data

Jun. 2, 2011 (CN) .......................... 2011 1 0147635

(51) Int. Cl.
*G08B 21/00* (2006.01)
(52) U.S. Cl.
USPC ................. 340/636.1; 340/635; 340/693.1

(58) Field of Classification Search
None
See application file for complete search history.

(56) References Cited

U.S. PATENT DOCUMENTS

| | | | | |
|---|---|---|---|---|
| 5,579,197 A | * | 11/1996 | Mengelt et al. | 361/93.4 |
| 2004/0228087 A1 | * | 11/2004 | Coglitore | 361/687 |
| 2010/0042860 A1 | * | 2/2010 | Kwon et al. | 713/340 |
| 2011/0255230 A1 | * | 10/2011 | Mori | 361/679.02 |

* cited by examiner

*Primary Examiner* — Mohammad Ghayour
*Assistant Examiner* — Brian Wilson
(74) *Attorney, Agent, or Firm* — Altis & Wispro Law Group, Inc.

(57) ABSTRACT

A rack server system includes a rack, a number of servers, and a power center. The rack defines a receiving space that is divided into a plurality of units. Each of the servers includes a motherboard and is received in a corresponding unit. The power center is received in at least one unit. The power center includes a plurality of cables connecting to the motherboards, respectively.

3 Claims, 3 Drawing Sheets

RACK SERVER SYSTEM

BACKGROUND

1. Technical Field

The present disclosure relates to a rack server system.

2. Description of Related Art

Rack server systems include a rack and a number of blade servers. The rack defines a receiving space which is divided into a number of units along the height direction of the rack. Each server is received in a corresponding unit and includes a power supply unit (PSU). The PSUs are connected to an external power source and supply power to the respective servers. However, because the PSU generates heat and obstructs heat dissipation, the heat dissipation efficiency of the corresponding server including the corresponding PSU therein is often less than satisfactory.

Therefore, it is desirable to provide a rack server system, which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
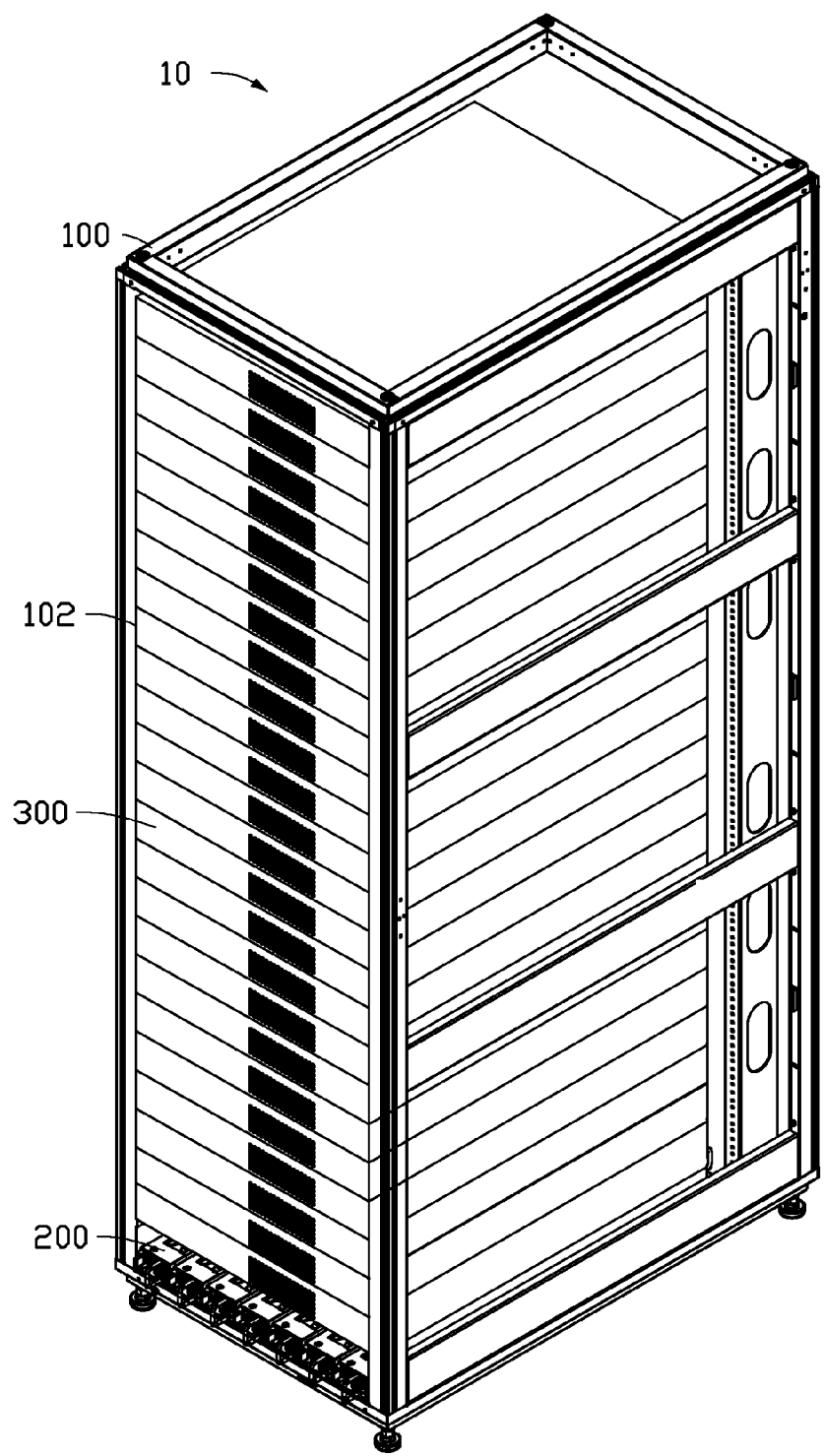
FIG. 1 is a schematic view of a rack server system, according to an embodiment.
Figure 2:
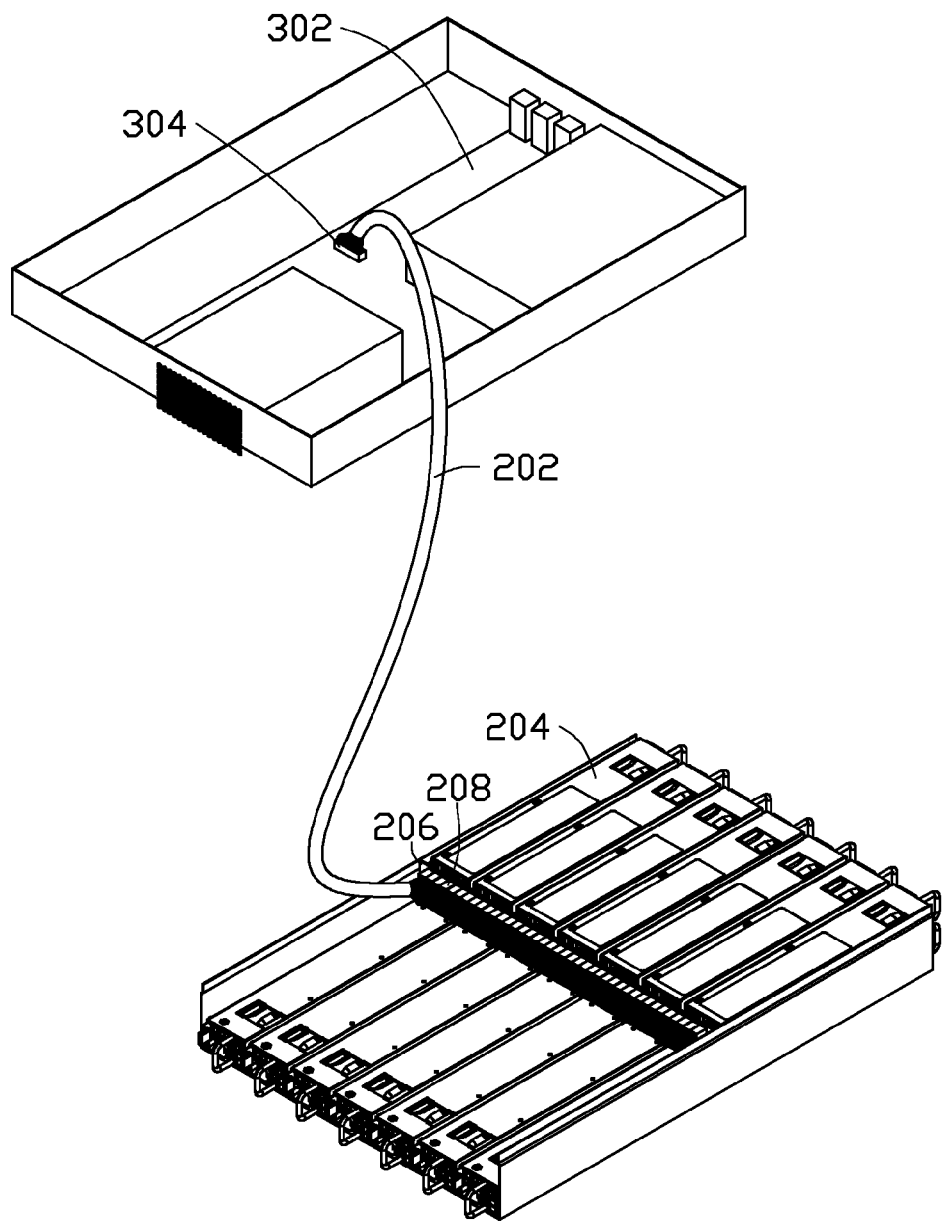
FIG. 2 is a schematic view of a power center and a server of the rack server system of FIG. 1.

Referring to FIGS. 1-2, a rack server system 10, according to an embodiment, includes a rack 100, a power center 200, and a number of blade servers 300. The rack 100 defines a receiving space (not labeled) that is divided into a number of units 102 along the height direction of the rack 100. Each server 300 includes a motherboard 302 and is received in a corresponding unit 102. The power center 200 is received in at least one other unit 102. That is, the power center 200 and the servers are received in the different units 102. The power center 200 is connected to the motherboards 302 via a number of respective cables 202 and thus provides power for the servers 300.

In detail, the power center 200 includes a number of PSUs 204, a power distribution board 206, and a number of first connectors 208. The PSUs 204 are connected to an external power source (not shown) and the power distribution board 206. The first connectors 208 are also connected to the power distribution board 206. The power distribution board 206 is configured for managing the outputs of the PSUs 206. For example, the power distribution board 206 distributes outputs of the PSUs 206 to the respective first connectors 208.

Each motherboard 302 includes a second connector 304. Each cable 202 connects a corresponding first connector 208 to a corresponding second connector 304, thus connecting the motherboards 302 to the power center 200.

Each PSU 204 is substantially cubic and the PSUs 204 are arranged at two sides of the power distribution board 206 in a compact array. The first connectors 208 are mounted to the power distribution board 206 also in a compact array. Thus, a size of the power center 200 is minimized to increase a space usage efficiency of the rack server system 100.

The number of the units 102 that the power center 200 occupies in this embodiment is two but is not limited to this embodiment and depends on need. In detail, in this embodiment, the number of the servers 30 is twenty. Accordingly, the number of the PSUs 204 is twenty as well. The PSUs 204 are arranged in two layers, each of which occupies one of the units 102. Therefore, the number of the units 102 occupied by the power center 200 is two. However, in other embodiments, if the number of the servers 300 reduces or increases, the number of the units 102 for the power center 200 may be changed correspondingly.

To avoid power interruption of a server 300 when the corresponding PSU 204 fails, the power center 200 also includes a redundant PSU 210. The redundant PSU 210 is also connected to the power distribution board 206. The power distribution board 206 is configured for detecting if any PSU 204 fails, and, if any, signaling the redundant PSU 210 to take over the failed PSU 210.

Figure 3:
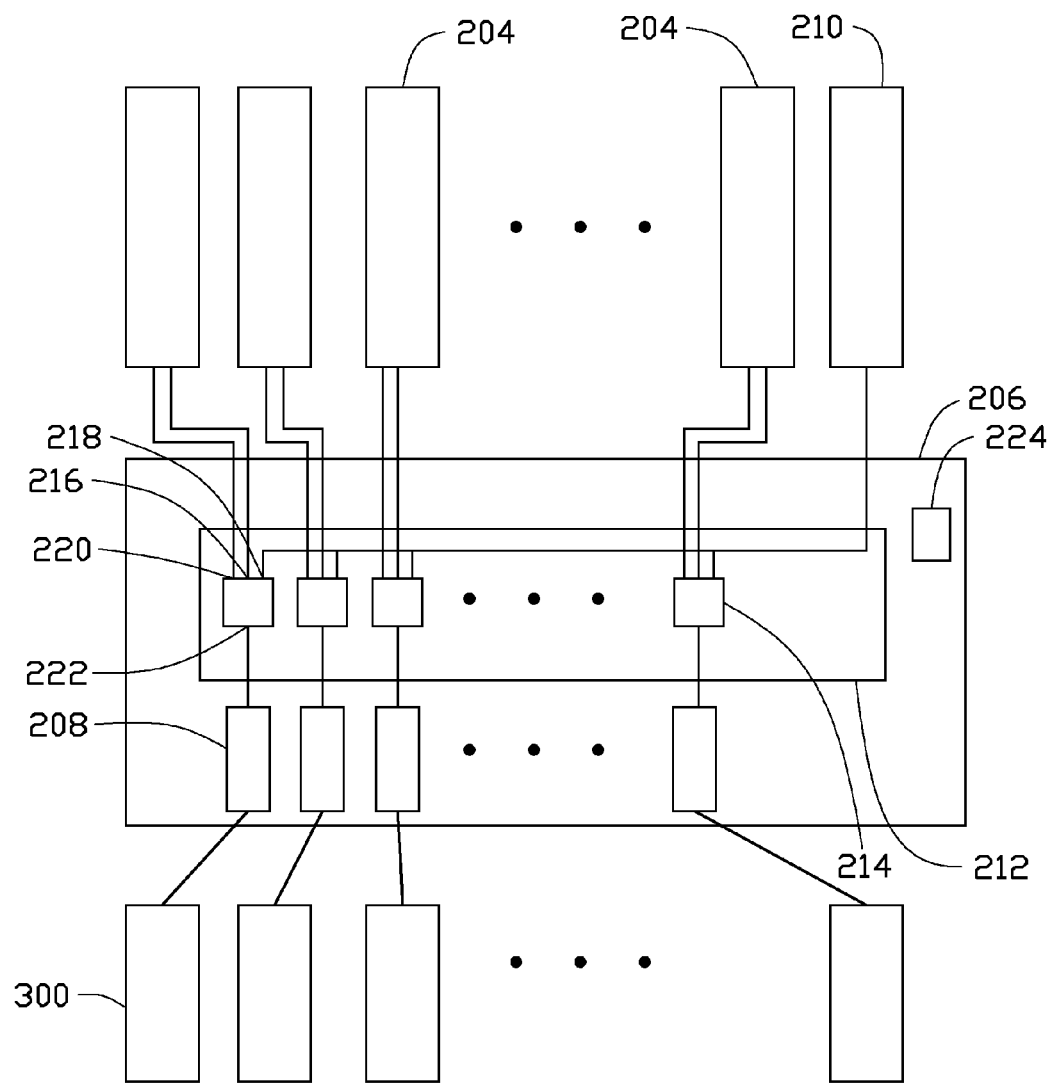
FIG. 3 is a circuit diagram of the power center of FIG. 2.

Also referring to FIG. 3, the power distribution board 206 can include a switch circuit 212. The switch circuit 212 includes a number of switches 214, such as a relay. Each switch 214 includes a first input 216, a second input 218, a control input 220, and an output 222. Each PSU 204 is connected to the first input 216 and the control input 220 of a corresponding switch 214. The redundant PSU 210 is connected to the second inputs 218. Each output 222 is connected to a corresponding motherboard 302 via a corresponding first connector 208. Each switch 214 is configured for connecting the corresponding first input 216 to the corresponding output 222 when the corresponding control input receives output from the corresponding PSU 204 and connecting the second input 218 to the output 222 when the output of the corresponding PSU 204 vanishes.

The power center 200 also includes a warning device 224, such as a buzzer or a lamp and associated circuits. The warning device 224 is connected to the power distribution board 206. The power distribution board 206 is configured for signaling the warning device 224 to give warnings if detecting that any PSU 204 fails, such as driving the buzzer to sound or driving the lamp to flick.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A rack server system comprising:
    a rack defining a receiving space that is divided into a plurality of units;
    a plurality of servers, each server comprising a motherboard and being received in a corresponding unit; and
    a power center received in at least one unit, the power center comprising a plurality of cables connecting to the motherboards, respectively;
    wherein the power center further comprises a plurality of power supply units (PSUs), a power distribution board, and a plurality of first connectors, the PSUs are connected to the power distribution board, the first connectors are connected to the power distribution board, the power distribution board is configured for distributing outputs of the PSUs to the respective first connectors, each motherboard comprises a second connector, and each cable connects a corresponding first connector to a corresponding second connector;

wherein the power center also comprises a redundant PSU, the redundant PSU is also connected to the power distribution board, the power distribution board is configured for detecting if any PSU fails and signaling the redundant PSU to take over the failed PSU;

wherein the power distribution board comprises a switch circuit, the switch circuit comprises a plurality of relays, each relay comprises a first input, a second input, a control input, and an output, each PSU is connected to the first input and the control input of a corresponding relay, the redundant PSU is connected to the second inputs, each output is connected to a corresponding first connector, and each relay is configured for connecting the corresponding first input to the corresponding output when the corresponding control input receives an output from the corresponding PSU and connecting the second input to the output when the output of the corresponding PSU vanishes.

2. The rack server system of claim 1, wherein the power center comprises a warning device, the warning device is connected to the power distribution board, the power distribution board is configured for signaling the warning device to give warnings if detecting that any PSU fails.

3. The rack server system of claim 2, wherein the warning device comprises an element selected from the group consisting of buzzer and lamp.

* * * * *